(12) United States Patent
Heath

(10) Patent No.: US 6,731,229 B2
(45) Date of Patent: May 4, 2004

(54) METHOD TO REDUCE STORAGE REQUIREMENTS WHEN STORING SEMI-REDUNDANT INFORMATION IN A DATABASE

(75) Inventor: Allen Webster Heath, Westlake, TX (US)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 09/780,734

(22) Filed: Feb. 9, 2001

(65) Prior Publication Data

US 2002/0116358 A1 Aug. 22, 2002

(51) Int. Cl.⁷ .................................................. H03M 7/30
(52) U.S. Cl. ............................................ 341/87; 341/50
(58) Field of Search ............................. 341/51, 65, 87, 341/95

(56) References Cited

U.S. PATENT DOCUMENTS

| | | | |
|---|---|---|---|
| 5,045,852 A | 9/1991 | Mitchell et al. | 341/51 |
| 5,305,433 A | 4/1994 | Ohno | 395/150 |
| 5,546,578 A | 8/1996 | Takada | 395/600 |
| 5,590,317 A | 12/1996 | Iguchi | 395/602 |
| 5,600,316 A | 2/1997 | Moll | 341/87 |
| 5,778,374 A | 7/1998 | Dang et al. | 707/101 |
| 5,870,087 A | 2/1999 | Chau | 345/302 |
| 5,983,239 A | 11/1999 | Cannon | 707/200 |
| 6,664,903 B2 * | 12/2003 | Kugai | 341/51 |

FOREIGN PATENT DOCUMENTS

JP 07271565 10/1995 ............. G06F/9/06

OTHER PUBLICATIONS

"Method for Incorporating Data Conversion into Text Compression Scheme", *IBM Technical Disclosure Bulletin*, vol. 36, No. 09B, Sep. 1993.

"Redundant MKH Files Design Among Multiple Disks for Concurrent Partial Match Retrieval", *Journal of Systems and Software*, vol. 35, No. 3, pp. 199–207, Dec. 1996 (Abstract Only).

* cited by examiner

Primary Examiner—Brian Young
(74) Attorney, Agent, or Firm—J. Bruce Schelkopf

(57) ABSTRACT

A method for reducing storage requirements in a database. The data to be encoded and stored in the database record is first analyzed to determine its characteristics. The data analyzed can be a sample of the records to enter and store or the entire data set. The analysis can be performed by a computer software module, or can be done manually, or by a combination of computer processing of the input stream of data and manual analysis to determine trends and characteristics. An encoding scheme is devised to encode the information input with a bit stream that represents the information. The information input is compacted to convert it into a uniform format. The encoded and compacted information are then stored in the corresponding database record. When a user wants to retrieve a particular record from the database, the compacted information is entered by the user, which in turn, is used as a key to retrieve the record. The encoded representation of the information input is retrieved with the record and is used to decode the compacted information into the original information input which is then displayed to the user. The original information input does not need to be stored in the database record as a result of this invention.

43 Claims, 3 Drawing Sheets

METHOD TO REDUCE STORAGE REQUIREMENTS WHEN STORING SEMI-REDUNDANT INFORMATION IN A DATABASE

BACKGROUND OF THE INVENTION

The present invention relates generally to data processing systems, and more particularly, to methods for reducing storage requirements in a database.

Many databases have been implemented that use a person's name as a key for record retrieval. To facilitate searching, these names are sometimes stored using an encoding scheme such as Soundex or Metaphone whereby fuzzy sound-like retrievals can be performed. The Soundex algorithm codes together surnames that sound similar but have different spellings. Soundex codes begin with the first letter of the surname, followed by a three-digit code that represents the first three remaining consonants. Zeros are added to names that do not have enough letters to be coded. In Soundex, consonants that sound alike have the same code. The coding guide is as follows:

1—B, P, F, V;
2—C, S, G, J, K, Q, X, Z;
3—D, T;
4—L;
5—M, N;
6—R.

The letters A, E, I, O, U, Y, H and W are not coded. Names with adjacent letters having the same equivalent number are coded as one letter with a single number. Surname prefixes are generally not used in the Soundex algorithm.

A Metaphone is an algorithm for encoding a word so that similar sounding words encode the same. It is similar to Soundex in purpose, but as it knows the basic rules of English pronunciation, it is more accurate. The higher accuracy requires more computational power, as well as more storage capacity. The algorithm reduces an input word to a one to eight or more character code using relatively simple phonetic rules for typical spoken English. Metaphone reduces the alphabet to sixteen consonant sounds: B, X, S, K, J, T, F, H, M, N, P, R, O, W, Y. Metaphone uses the following transformation rules: doubled letters, except "c", drop the second letter; keep vowels only when they are the first letter.

Additionally, names can also be stored in an uppercase alphanumeric version to facilitate searching by partial character matches. When either of these methods are used to facilitate searching, the original mixed case name is also stored for display purposes as the "as originally entered" format. Obviously, storing a name in both an uppercase alphanumeric only version as well as the original mixed case true format may double the storage requirements.

This problem can be best described by an example. In a health provider's network, there typically exists a master person index (MPI) that is used to resolve a name to a single person, given a wide variety of partially complete and potentially different input fields. For example, assume a person's last name is "Mendez-Perez." One operator may input the name as written (i.e., "Mendez-Perez") while another operator may input the name as "Mendez Perez" or as "mendezperez." To facilitate the expected outcome of searching of the database for this person, a retrieval key field may be created that is the uppercase alphabetic characters only, thus "MENDEZPEREZ" would be searched for in the column of the "squished" representation of the name. In this example, the "squished" representation is formed by converting all letters to uppercase and ignoring any character that is not an uppercase alphabetic character, thus a space, or hyphen would be discarded. Once the appropriate record has been found, the mixed case version of the name should be used for display at the operator's console.

One solution to the above problem is to simply fetch and apply the "squish" rule record by record to the name as originally input column of the database. This would be a very slow process since repetitive processing would need to be done for each search. Therefore, such a method is not a viable solution. Another approach that can be used is to store two columns, one already squished, and the other as originally input; thus doubling the storage space needed.

The well-known "zip" and "Hoffman" encoding techniques are optimized for, and function on a long series of subcharacter strings in long textual documents. What is needed is an algorithm that works better for encoding short common name character sequences where the data must exist in multiple forms for: (1) database searching and (2) display back to the operator.

One alternative is a simple bit mapping providing upper/lower case flagging information, but that alternative does not provide for reinsertion of the characters removed by a "squish" algorithm, i.e., the algorithm will only provide information if the character is translated to lower case, or copied as is.

SUMMARY OF THE INVENTION

This invention attempts to minimize the storage requirements required in keeping both forms of the name, one for machine searching/record retrieval consistency, and the other for human display. By using this invention, the space requirements per record can be greatly reduced thus allowing more records to be stored on the same media, and as a by-product of smaller databases, the information retrieval process can also be sped up.

This invention applies where the data needs to be stored in a compacted or "squished" format to facilitate a retrieval key, and the original input data must also be capable of being recreated. This invention applies where the general characteristics of the data to be stored are well known such that frequency of exception characters can be predicted in advance to assign the most efficient encoding scheme to the data. This invention applies to short strings rather than long lengthy texts.

The data to be encoded and stored in the database record is first analyzed to determine its characteristics. If the representation of a person's name is to be encoded in a bit string, then the data will be characterized by uppercase and lowercase alphabetic characters with a few additional characters such as an apostrophe or hyphen. The data analyzed can be a sample of the records to enter and store or the entire data set. The analysis can be performed by a computer software module, or can be done manually, or by a combination of computer processing of the input stream of data and manual analysis to determine trends and characteristics. An encoding scheme is then devised to encode the information input with a bit stream that represents the information. The information input is then compacted to convert the information input into a uniform format (e.g., all uppercase alphabetic characters or all lowercase alphabetic characters). The encoded and compacted information are then stored in a corresponding database record.

When a user wants to retrieve a particular record from the database, the information is entered by the user and the system compacts it, which in turn, is used to locate the record(s) in the database. The compacted information is used as a key to retrieve the record. The encoded representation of the information is retrieved with the record and is then used to decode the compacted information into the original information input which is displayed to the user. The original information input does not need to be stored in the database record as a result of this invention.

DESCRIPTION OF THE DRAWINGS

The invention is better understood by reading the following detailed description of the invention in conjunction with the accompanying drawings, wherein.

DETAILED DESCRIPTION OF THE INVENTION

This invention is used in conjunction with a two-column storage approach in which the squished (compacted) information is searched, but then instead of simply retrieving a second column for display of the original unaltered information, the invention applies an algorithm to "unsquish" the result for display to the user. The goal of the unsquish algorithm is that the space needed to store the information to recreate the original form of the information is less than the amount of space needed to store the second semi-redundant copy of the information, i.e., to be able to return the mixed case representation as well as special characters and spaces that may have been present in the original form, and to do so utilizing less space than is required to store two copies of the data.

Figure 1:
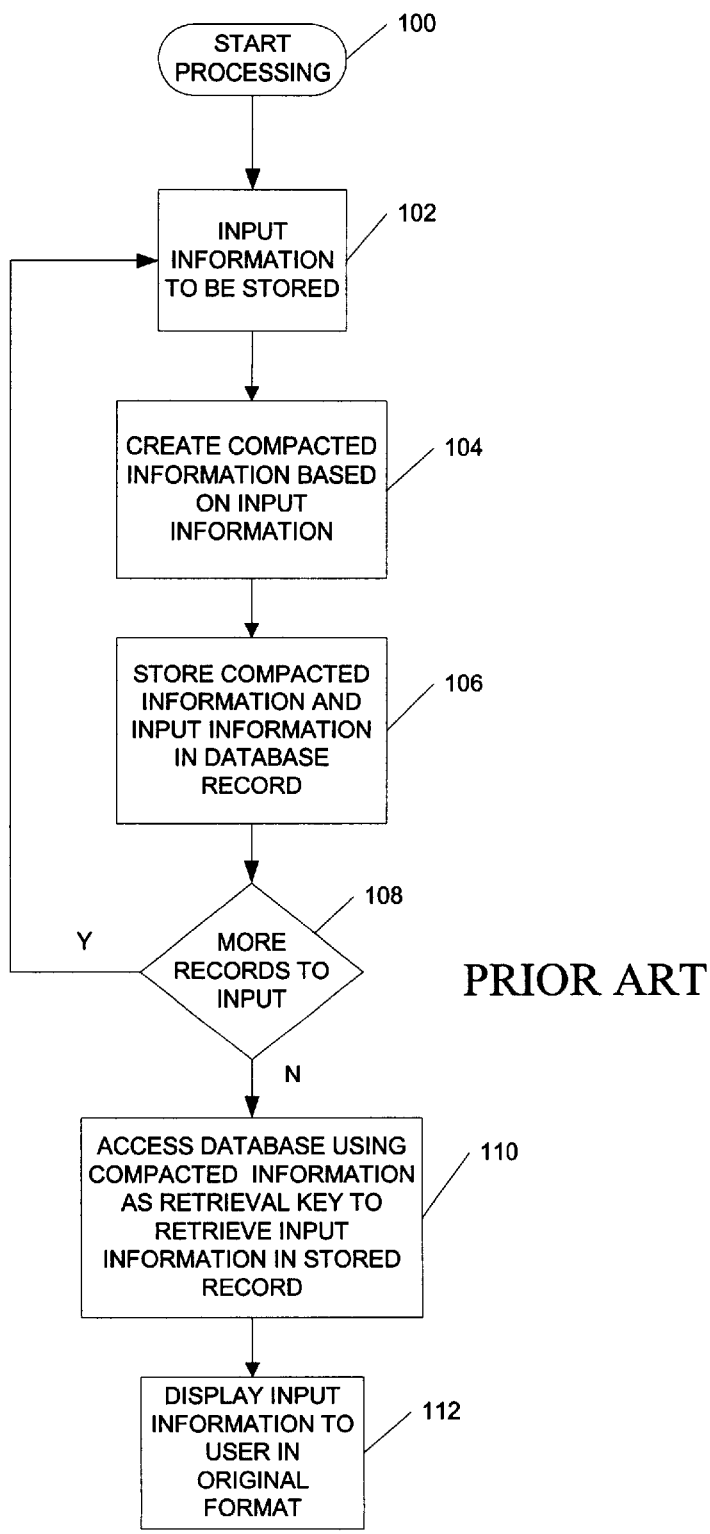
FIG. 1 illustrates a prior art method for storing and retrieving records from a database using a compacted key for retrieval.

As described in the background of the invention, prior art methods stored both the original information and the compacted information in a database record, with the compacted information used as a retrieval key. FIG. 1 illustrates a typical prior art process. As illustrated, processing starts in logic block 100. The original information field that is to be stored is inputted to a data processing system, as indicated in logic block 102. A compacted information field is created based on the input information, as indicated in logic block 104. Both the compacted and original information are then stored in the same database record as indicated by logic block 106. In decision block 108, a test is made to determine if there are more records to be input. If there are, then processing returns to logic block 102. Otherwise, the database can then be queried by an end user. The database is accessed using the compacted information as a retrieval key to retrieve the original input information that is stored in the same record, as indicated in logic block 110. The input information in its original format is then displayed to the user, as indicated in logic block 112.

The invention encodes input information into a varying number of bits to reconstruct the original information. The code is designed such that the common information about an individual character position may be encoded in a minimal number of bits. This is different from previous data compaction schemes such as the "zip" program and other similar such programs in that those algorithms typically form a dictionary of common letters or sequences and attempt to reduce long sequences of general words into shorter encoded sequences. In the case of this invention, there is no long sequence of words to encode, thus that type of data compaction will not improve the storage requirements.

Figure 2:
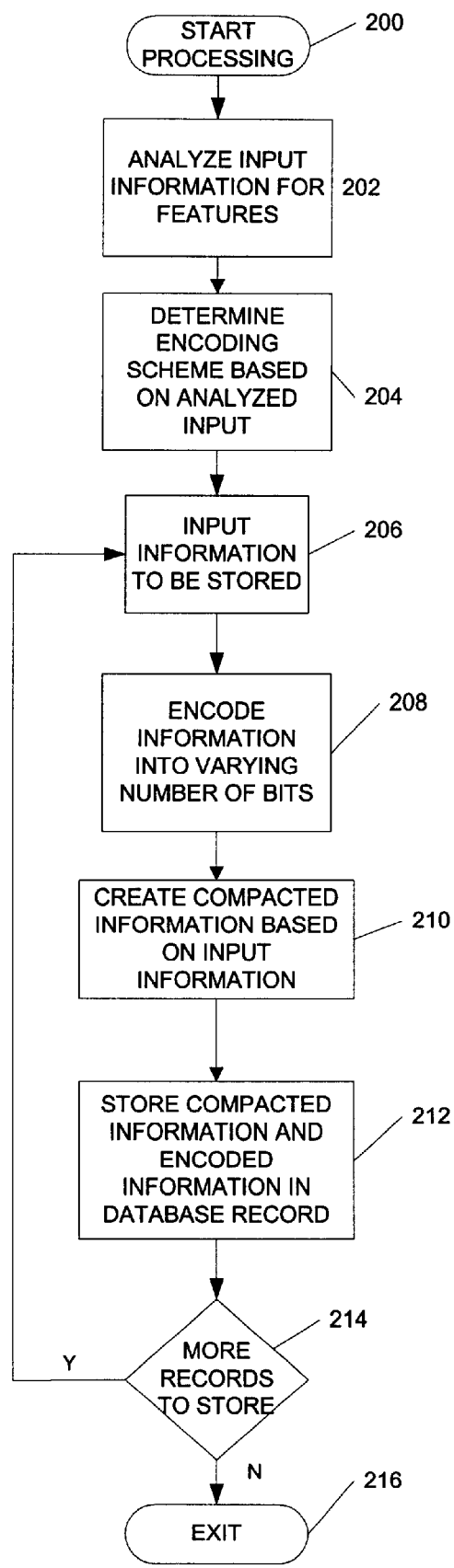
FIG. 2 illustrates the processing logic for a data encoding scheme in accordance with an exemplary embodiment of the present invention.

FIG. 2 illustrates the processing logic for the data encoding scheme of the present invention. As indicated, processing begins with start block 200. In logic block 202, the input information is analyzed for common features in the information. This analysis can be performed automatically by computer software, manually by the person devising the encoding scheme, or by a combination of software and human processing. Based on the results of the analysis of the input information, an encoding scheme is determined as indicated in logic block 204. Once an encoding scheme is in place for the data to be input, the information to be stored is then entered as indicated in logic block 206. Note that in this invention, the original input information is not actually stored in the database. As indicated in logic block 208, the input information is then encoded into a varying number of bits based on the encoding scheme devised for the analyzed input information. A compacted information entry is then created by the software that is based on the original input information as indicated in logic block 210. The compacted information entry and the encoded entry representative of the original input information are then stored in the same database record, as indicated in logic block 212. Next, in decision block 214, a determination is made as to whether or not there are more records to store. If not, then processing exits in termination block 216. Otherwise, processing returns to logic block 206.

Figure 3:
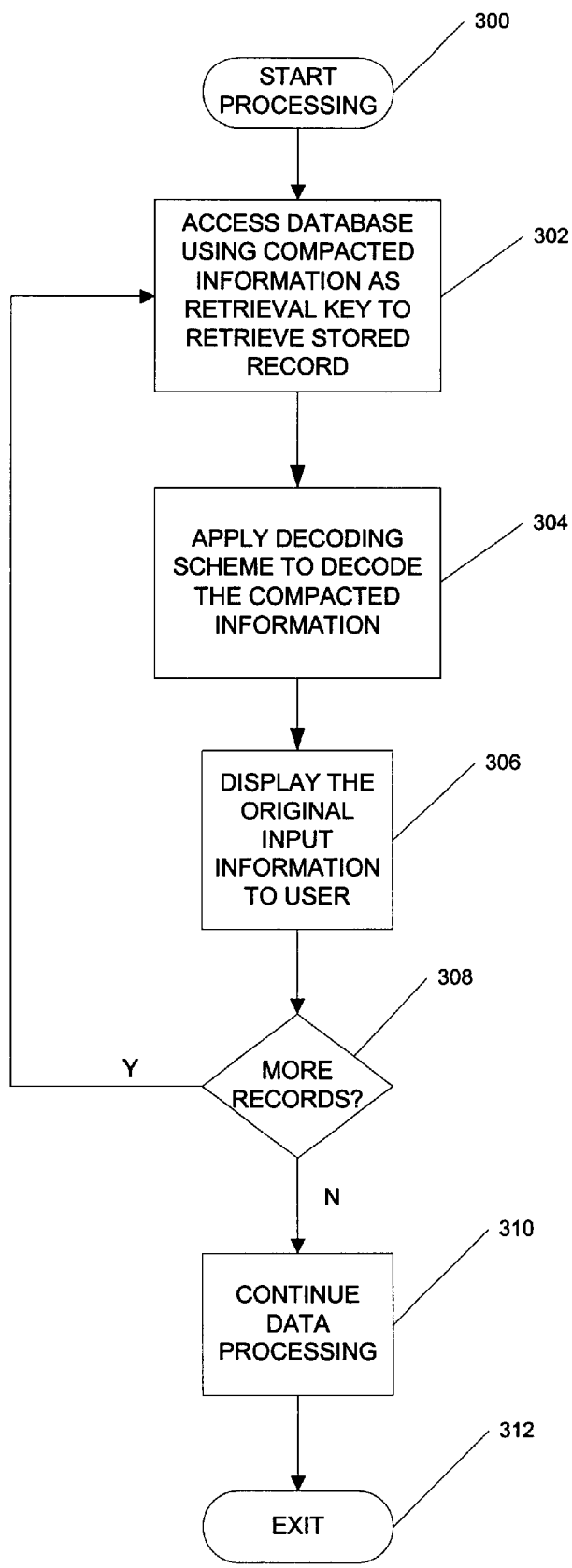
FIG. 3 illustrates the processing logic for retrieval of stored records in accordance with an exemplary embodiment of the present invention.

FIG. 3 illustrates the processing logic for the retrieval of records stored using the data encoding scheme of the present invention. The process for retrieving records starts with logic block 300. The database is then accessed by an end user, using the compacted information as the retrieval key to retrieve a particular stored record, as indicated in logic block 302. A decoding scheme is then applied to decode the compacted information as indicated in logic block 304. The decoding scheme is completely dependent on the encoding scheme that is used to encode the original input information. Once the compacted information is decoded into the original input information, the latter is then displayed to the end user, as indicated in logic block 306. Next, in decision block 308, a test is made to determine if there are more records to retrieve. If there are, then processing returns to logic block 302. Otherwise, data processing of the retrieved records continues as indicated in logic block 310. Once processing is completed, there is an exit from the software program as indicated in logic block 312.

In many databases, names are used as the basis for retrieval of individual records. By analysis of names, one can see that there are: (1) a simple state (uppercase vs lower case); (2) some common special characters (e.g., spaces, hyphens, and periods), and (3) some rare exception characters to encode. By assigning an increasing number of bits to represent each one of these states, it is possible to encode typical names into a number requiring a small number of bytes. The encoding algorithm can be described as follows:

In the base case, assign two bits as follows:
    00 if the current character is a lower case character;
    01 if the current character is an upper case character;
    10 if the current character is a space;
    11 if none of the above, then use four bits to describe the first exception as:

0011 if the current character is a hyphen;
0111 if the current character is a period;
1011 if the current character is an apostrophe;
1111 if none of the above applies, then use additional eight bits to encode the complete exception character:
xxxxxxxx1111 where xxxxxxxx is the complete exception character.

The assignment of '10' to space, '0011' to hyphen, '0111' to period, and '1011' to apostrophe is an arbitrary assignment based on the results of an analysis of local data. In this specific case, spaces in the input were more common than the other three exceptions, and the next most common exception characters were the hyphen, period, and apostrophe character. By analyzing the local data in another implementation, another set of characters can be assigned to these codes based on the common sequences in the local data. For example, an analysis of another set of data may show that the apostrophe character occurs more frequently than the space, in which case the implementer would alter the assignment of the codes. The intent of the algorithm is to encode the common sequences as efficiently as possible.

In the above description of the algorithm, there are two "escape" patterns that have been implemented in which the number of effective bits is increased to represent the information, i.e., if the least significant bits are all ones . . . 11—escape to a four-bit code; 1111—escape to a 12-bit code. Obviously, 00 and 0000 (or other combinations) can be used as an escape pattern, however, by analysis of the name data that is being encoded, additional advantage can be gained by assigning the 00 code to mean a "lower case" character. This is because the normal default operation preferably performed on the squished representation is to return it to the original state based on how most names are written. If an analysis of a particular set of data shows that after a certain point, all characters are very likely to be lower case, then by assigning numerical values least significant to most significant as characters are processed left to right and stopping when all the bits of precision are assigned, the algorithm will get a 0 value by default and thus perform the expected "lowercasing" of the trailing character. Taking a very simplified example to explain this phenomena and see how this feature can also be used, consider the case in which a name that is n characters (bytes) long, and the apostrophe is the most common exception, thus it is assigned the '01' code.

example name: D'Allison squished: DALLISON code: 011001 or with the leading zeros, 00 0000 0000 0001 1001

Thus the code could be stored in one byte when the leading zeros are assumed present.

The unsquishing algorithm then executes as follows:

Step 1: The two least significant bits of the code '011001' are '01' meaning the character was originally upper case, so "D"→"D".

The code is then divided by 4 (i.e., two bits worth of information processed) and the integer portion kept, thus '011001'→'0110'.

Step 2: The least significant bits of the code are now '10' which means an apostrophe was in the original input, thus we now build up to "D'".

The code is again divided by 4 (two additional bits worth of information processed) and the integer portion kept, thus '0110'→'01'.

Step 3: The two least significant bits of the code '01' are '01' meaning the character was originally upper case, so "A"→"A" and the string has been built up to "D'A".

The code is again divided by 4 (two additional bits worth of information processed) and the integer portion kept, thus '01'→numerical 0.

Step 4: The two least significant bits of the code are '00' meaning the character was originally lower case, so "L"→"l".

The code (0) divided by 4 is still 0.

Step 5: Continued processing results in "L"→"l", "I"→"i", "S"→"s", "O"→"o", "N"→"n", thus "D'Allison" is reconstructed from "DALLISON" and the coded number 25 decimal.

Thus, the algorithm of the present invention allows an acceptable trade off between the number of bits allocated for the precision of the code and the default operation of "lowercasing" the characters. This means that one could assign one, two, three, four, or eight bytes to store the code and still yield a locally-defined acceptable representation of the original input. The implementation can accept a default operation for unsquishing after exceeding a certain defined precision. For example, if "J. D. Smithers" was encoded into two bytes, the decoding could yield "J. D. smithers" whereas 3 to 8 bytes would yield "J. D. Smithers". In all cases, the storage is less than that which would be required if the data is stored unencoded in both input and squished forms. Therefore, the installation can decide how critical exact returning of the input is versus most likely. In the example with "J. D. Smithers", 14 characters can be reduced to a total of 13 bytes representing both the 10-byte "squished" search field ("JDSMITHERS") and the three-byte code to unsquish back to "J. D. Smithers" versus having to allocate a total of 24 bytes to store both the squished "JDSMITHERS" and the original "J. D. Smithers". It is interesting to note that in this example, storing just the original input requires more storage than the total storage for both formats using this invention.

This invention can be extended to different code patterns based on the analysis of the data to be encoded. For example, if an analysis of the particular data set shows mainly lower case characters with a high frequency of numbers that are discarded during the squish algorithm, the code can be as follows:

0—lower case character;
00001—digit 0;
00011—digit 1;
. . .
01111—digit 7;
10001—digit 8;
10011—digit 9;
10101—upper case character;
10111—space;
11001—another high frequency character exception, perhaps a period;
11011—another high frequency character exception, perhaps a comma;
11101—another high frequency character exception, perhaps a hyphen;
yyyyyyyy11111—low frequency character exception, character=yyyyyyyy.

This coding represents a one bit code with '1' being the escape sequence to a five bit code. This is in contrast to the two bit code described previously, which escaped from '11' to a four bit code.

An example using the above modified code could be street address data where for searching purposes, the numbers are discarded and only the street name is used, with the street names entered in mixed case. Thus, the extra bits required to unsquish the digits can be traded against the single bit needed to represent a lower case alphabetic character. In other implementations, each particular data set needs to be analyzed to determine the encoding scheme that generates the most savings.

To support person resolution in a health provider's network, the master person index component may store several 30-character name field, such as first name, middle name, last name, mother's first name, mother's last name, father's first name, and father's last name. If all seven fields are stored in both "squished" and as originally input mixed case, it would require 2×7×30 bytes=420 bytes per record.

By implementing the above algorithm using a "BIGINT" (64 bit) encoding for the algorithm, only (7×30)+(7×8)=266 bytes are required saving 154 bytes per record. Also, 64 bits allows for total encoding of all 30 bytes of characters with provision for several spaces as well as a couple of common exception characters such as apostrophe, period, and hyphen. The algorithm can also easily accommodate exception strings such as "{Baby Girl}" which is often entered for newborns in the health provider's database when the actual name is not known. In this case, even counting the { } exception characters, the squished name "BABY GIRL" can easily be reconstituted back to "{Baby Girl}" using the 64-bit integer code. The savings can be significant in a typical customer environment of 1,000,000 to 10,000,000 person records.

The present invention is realized in software. Any kind of computer system or other apparatus adapted for carrying out the methods described herein is suited. A typical combination of hardware and software could be a general purpose computer system with a computer program that, when loaded and executed, controls the computer system such that it carries out the methods described herein. The present invention can also be embedded in a computer program product, which includes all of the features enabling the implementation of the methods described herein and which, when loaded in a computer system, is able to carry out these methods.

Computer program instructions or computer program in the present context means any expression in any language, code or notation, or a set of instructions intended to cause a system having an information processing capability to perform a particular function, either directly or when either or both of the following occur: (a) conversion to another language, code or notation; (b) reproduction in a different material form.

Those skilled in the art will appreciate that many modifications to the preferred embodiment of the present invention are possible without departing from the spirit and scope of the present invention. In addition, it is possible to use some of the features of the present invention without the corresponding use of the other features. Accordingly, the foregoing description of the preferred embodiment is provided for the purpose of illustrating the principles of the present invention and not in limitation thereof since the scope of the present invention is defined solely by the appended claims.

What is claimed is:

1. A method for reducing data storage requirements in a database comprising the steps of:
    analyzing the input data to determine common sequences in the data;
    determining an encoding scheme for the input data as a result of the analyzing step;
    encoding the input data into a varying number of bits using the encoding scheme;
    compacting the input data by converting any state characters and removing any special characters that are present in the input data; and
    storing the compacted input data along with the corresponding encoded input data in a database record.

2. The method for reducing data storage requirements of claim 1 wherein the analyzed input data comprises a character sequence that represents a person's name.

3. The method for reducing data storage requirements of claim 1 wherein the analyzed input data comprises a character sequence that represents an address.

4. The method for reducing data storage requirements of claim 1 wherein the act of converting any state characters includes the act of changing alphabetic characters to a uniform alphabetic format.

5. The method for reducing data storage requirements of claim 1 wherein the act of removing any special characters includes the act of deleting all characters in the input data that are not alphabetic characters.

6. The method for reducing data storage requirements of claim 1 wherein the step of encoding the input data comprises the act of assigning a predetermined number of bits to each character in the input data based on the encoding scheme.

7. The method for reducing data storage requirements of claim 6 wherein the step of encoding the input data further comprises the act of assigning predetermined bit patterns of at least two bits to encode uppercase alphabetic characters, lowercase alphabetic characters, and at least one special character.

8. The method for reducing data storage requirements of claim 6 wherein the step of encoding the input data further comprises the act of assigning at least four bits to encode special characters in the data.

9. The method for reducing data storage requirements of claim 8 wherein the special characters include at least one of a hyphen, an apostrophe, a period and a space.

10. The method for reducing data storage requirements of claim 1 wherein the encoding scheme includes at least one escape bit pattern in which the effective number of bits is increased to represent the information in the data.

11. The method for reducing data storage requirements of claim 10 wherein the at least one escape bit pattern contains a predetermined bit pattern in the least significant bit positions.

12. The method for reducing data storage requirements of claim 10 wherein the at least one escape bit pattern contains a plurality of contiguous bits in the same state in the least significant bit positions.

13. The method for reducing data storage requirements of claim 7 wherein each lowercase character is encoded with two bits in the same state in the least significant bit positions.

14. The method for reducing data storage requirements of claim 1 wherein the step of encoding the input data includes the act of assigning a predetermined bit pattern to each character in the input data.

15. The method for reducing data storage requirements of claim 14 wherein a single bit is used to represent a lowercase alphabetic character.

16. A computer readable medium containing a computer program product for reducing data storage requirements in a database, the computer program product comprising:
    program instructions that determine an encoding scheme for an input data;
    program instructions that encode the input data into a varying number of bits using the encoding scheme;
    program instructions that compact the input data by converting any state characters and removing any special characters that are present in the input data; and program instructions that store the compacted input data along with the corresponding encoded input data in a database record.

17. The computer program product for reducing data storage requirements of claim 16 further comprising program instructions that analyze the input data to determine common sequences in the data.

18. The computer program product for reducing data storage requirements of claim 17 wherein the analyzed input data comprises a character sequence that represents a person's name or an address.

19. The computer program product for reducing data storage requirements of claim 16 wherein program instructions that of convert any state characters include program instructions that change alphabetic characters to a uniform alphabetic format.

20. The computer program product for reducing data storage requirements of claim 16 wherein program instructions that remove any special characters include program instructions that delete all characters in the input data that are not alphabetic characters.

21. The computer program product for reducing data storage requirements of claim 16 wherein program instructions that encode the input data further comprise program instructions that assign a predetermined number of bits to each character in the input data based on the encoding scheme.

22. The computer program product for reducing data storage requirements of claim 21 wherein program instructions that encode the input data further comprise program instructions that assign predetermined bit patterns of at least two bits to encode uppercase alphabetic characters, lowercase alphabetic characters, and at least one special character.

23. The computer program product for reducing data storage requirements of claim 16 wherein program instructions that encode the input data further comprise program instructions that assign at least four bits to encode special characters in the data.

24. The computer program product for reducing data storage requirements of claim 23 wherein the special characters include at least one of a hyphen, an apostrophe, a period and a space.

25. The computer program product for reducing data storage requirements of claim 16 wherein the encoding scheme includes at least one escape bit pattern in which the effective number of bits is increased to represent the information in the data.

26. The computer program product for reducing data storage requirements of claim 25 wherein the at least one escape bit pattern contains a predetermined bit pattern in the least significant bit positions.

27. The computer program product for reducing data storage requirements of claim 25 wherein the at least one escape bit pattern contains a plurality of contiguous bits in the same state in the least significant bit positions.

28. The computer program product for reducing data storage requirements of claim 22 wherein each lowercase character is encoded with two bits in the same state in the least significant bit positions.

29. The computer program product for reducing data storage requirements of claim 16 wherein program instructions that encode the input data include program instructions that assign a predetermined bit pattern to each character in the input data.

30. The computer program product for reducing data storage requirements of claim 29 wherein a single bit is used to represent a lowercase alphabetic character.

31. A system for reducing data storage requirements in a database, comprising:
   at least one storage device for storing the database; and
   a computer processor connected to the at least one storage device and operating a computer program including:
      an analysis component for determining an encoding scheme for the input data;
      an encoding component that encodes the input data into a varying number of bits using the encoding scheme;
      a compacting component that converts any state characters and removes any special characters that are present in the input data; and
      a storage component that stores the compacted input data along with the corresponding encoded input data in a database record.

32. The system for reducing data storage requirements in a database of claim 31 wherein the computer program further comprises a component that analyzes the input data to determine common sequences in the input data.

33. The system for reducing data storage requirements in a database of claim 31 wherein the compacting component further comprises a module that changes alphabetic characters to a uniform alphabetic format.

34. The system for reducing data storage requirements in a database of claim 31 wherein the compacting component further comprises a module that deletes all characters in the input data that are not alphabetic characters.

35. The system for reducing data storage requirements in a database of claim 31 wherein the encoding component further comprises a module that assigns a predetermined number of bits to each character in the input data based on the encoding scheme.

36. The system for reducing data storage requirements in a database of claim 35 wherein the encoding component further comprises a module that assigns a predetermined bit pattern of at least two bits to encode uppercase alphabetic characters, lowercase alphabetic characters, and at least one special character.

37. The system for reducing data storage requirements in a database of claim 35 wherein the encoding component further comprises a module that assigns at least four bits to encode special characters in the data.

38. The system for reducing data storage requirements in a database of claim 31 wherein the encoding scheme includes at least one escape bit pattern in which the effective number of bits is increased to represent the information in the data.

39. The system for reducing data storage requirements in a database of claim 38 wherein the at least one escape bit pattern contains a predetermined bit pattern in the least significant bit positions.

40. The system for reducing data storage requirements in a database of claim 38 wherein the at least one escape bit pattern contains a plurality of contiguous bits in the same state in the least significant bit positions.

41. The system for reducing data storage requirements in a database of claim 36 wherein each lower case character is encoded with two bits in the same state in the least significant bit positions.

42. The system for reducing data storage requirements in a database of claim 31 wherein the encoding component includes a module that assigns a predetermined bit pattern to each character in the input data.

43. The system for reducing data storage requirements in a database of claim 42 wherein a single bit is used to represent a lowercase alphabetic character.

\* \* \* \* \*